United States Patent
Jain et al.

(10) Patent No.: US 10,263,627 B1
(45) Date of Patent: Apr. 16, 2019

(54) DELAY-LOCKED LOOP HAVING INITIALIZATION CIRCUIT

(71) Applicant: NXP USA, INC., Austin, TX (US)

(72) Inventors: Deependra Jain, Noida (IN); Krishna Thakur, Gautambudh Nagar (IN); Gaurav Agrawal, Aligarh (IN)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/838,430

(22) Filed: Dec. 12, 2017

(51) Int. Cl.
| | |
|---|---|
| *H03L 7/00* | (2006.01) |
| *H03L 7/10* | (2006.01) |
| *H03K 5/01* | (2006.01) |
| *H03L 7/089* | (2006.01) |
| *H03K 5/00* | (2006.01) |

(52) U.S. Cl.
CPC ............ *H03L 7/10* (2013.01); *H03K 5/01* (2013.01); *H03L 7/0891* (2013.01); *H03K 2005/00019* (2013.01)

(58) Field of Classification Search
CPC .......... H03L 7/10; H03L 7/0891; H03K 5/01; H03K 2005/00019
USPC .................................................. 327/147–158
See application file for complete search history.

(56) References Cited

U.S. PATENT DOCUMENTS

| | | | |
|---|---|---|---|
| 7,190,201 B2 | 3/2007 | Haerle et al. | |
| 7,209,533 B1 | 4/2007 | Nguyen et al. | |
| 7,755,404 B2* | 7/2010 | Lin ....................... | H03L 7/0812 |
| | | | 327/149 |
| 8,063,708 B2* | 11/2011 | Kim ........................ | H03L 7/0891 |
| | | | 327/157 |
| 8,503,598 B2 | 8/2013 | Mai | |
| 9,112,507 B2* | 8/2015 | Chen ....................... | H03L 7/101 |
| 9,337,818 B1 | 5/2016 | Thakur et al. | |
| 9,419,629 B1 | 8/2016 | Agrawal et al. | |
| 2004/0251970 A1* | 12/2004 | Fayneh ................. | H03L 7/0893 |
| | | | 331/16 |
| 2006/0087435 A1* | 4/2006 | Kim ....................... | H03L 7/0812 |
| | | | 340/572.1 |
| 2008/0007311 A1* | 1/2008 | Choi ....................... | H03L 7/087 |
| | | | 327/156 |
| 2009/0091362 A1* | 4/2009 | Pellerano .................. | H03L 7/07 |
| | | | 327/158 |
| 2010/0141346 A1* | 6/2010 | Chen ..................... | H03L 7/0995 |
| | | | 331/15 |
| 2011/0221494 A1* | 9/2011 | Chen ......................... | H03L 3/00 |
| | | | 327/157 |
| 2011/0309867 A1* | 12/2011 | Choi ....................... | H03L 7/113 |
| | | | 327/157 |

* cited by examiner

*Primary Examiner* — Ryan Jager

(57) ABSTRACT

A delay-locked loop (DLL) includes a delay line configured to receive a reference clock signal and a control signal, and generate a first plurality of clock signals. Each clock signal of the first plurality is configured to have a different phase delay relative to the reference clock signal. A phase frequency detector is coupled to the delay circuit and is configured to receive a first clock signal and a second clock signal of the first plurality, and generate up and down control signals. A charge pump is coupled to receive the up and down control signals and generates a charge pump current based on the up and down control signals. An output of the charge pump is coupled to the delay line at a voltage control node. An initialization circuit is coupled to the voltage control node and is configured to generate an initialization voltage based on the reference clock signal frequency.

16 Claims, 4 Drawing Sheets

US 10,263,627 B1

DELAY-LOCKED LOOP HAVING INITIALIZATION CIRCUIT

BACKGROUND

Field

This disclosure relates generally to timing circuits, and more specifically, to a delay-locked loop (DLL) having an initialization circuit.

Related Art

Today, electronic devices, such as, digital signal processors, microcontrollers, memory devices, and other input/output devices, for example, often require the use of multiple delayed clock signals. Several techniques have been used to generate multiple delayed clock signals, however, many of these techniques do not meet the frequency range requirements of high-end electronic devices. Therefore, the need exists for an improved design that generates multiple delayed clock signals over a broad frequency range.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A delay-locked loop (DLL) may be used in a clock generator, an on-chip clock distribution system, a clock recovery system, and the like, for example. Such DLLs are expected to generate an output clock that has the same frequency as an input clock and that is delayed by a voltage-controlled delay line. However, DLLs have been commonly designed for a fixed input frequency or a very limited range of operating frequencies due to tendencies of false locking.

Generally, there is provided, DLL initialization circuitry which tracks input frequency and process, voltage, and temperature (PVT) variations, and generates an initialization point within the proximity of a desired lock point, ensuring correct locking over a broad range of operating frequencies. A reference clock received by a voltage-controlled delay line is also provided to the DLL initialization circuitry. By using a switched capacitor circuit controlled by non-overlapping versions of the reference clock, an initialization voltage signal is generated which tracks the reference clock frequency and allows fast and accurate DLL locking.

Figure 1:
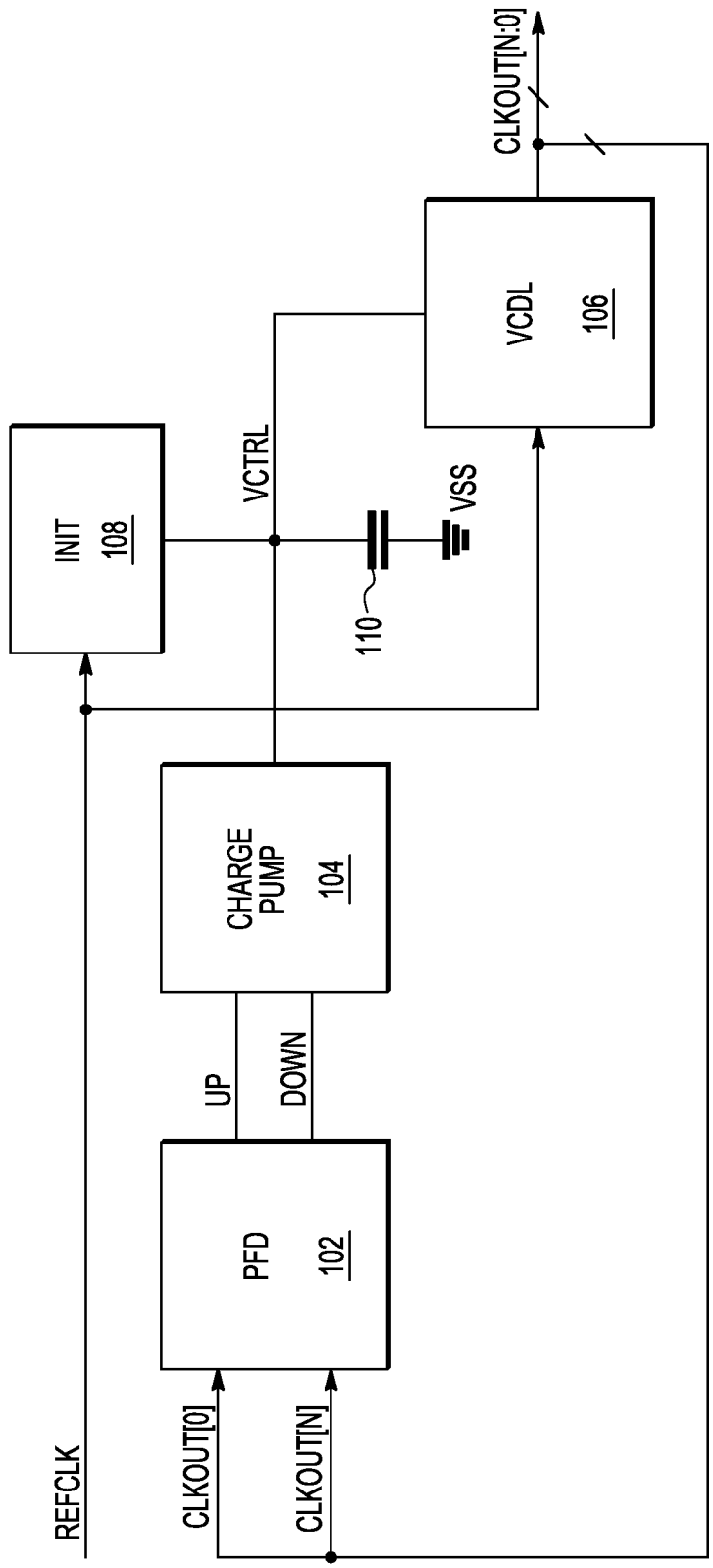
FIG. 1 illustrates, in simplified block diagram form, exemplary delay-locked loop (DLL) in accordance with an embodiment of the present invention.

FIG. 1 illustrates, in block diagram form, exemplary delay-locked loop (DLL) 100 in accordance with an embodiment of the present invention. DLL 100 receives a reference clock signal labeled REFCLK and generates a plurality of output clock signals labeled CLKOUT[N:0], where N may be may be an integer number corresponding to a number of output clock signals. DLL 100 includes phase frequency detector (PFD) circuit block 102, charge pump circuit block 104, voltage-controlled delay line (VCDL) circuit block 106, initialization circuit block 108, and capacitor 110. DLL 100 generates output clocks CLKOUT [N:0] that have the same frequency as input reference clock REFCLK.

The PFD 102 controls the phase delay generated by the VCDL 106 based on a comparison of the output clocks CLKOUT[0] and CLKOUT[N], where CLKOUT[0] is a first output clock and CLKOUT[N] is an Nth or last output clock in a chain of delayed output clock signals. The VCDL 106 output clocks CLKOUT[0] and CLKOUT[N] are fed back to the PFD 102. Based on the detected phase difference between the clocks CLKOUT[0] and CLKOUT[N], the PFD 102 generates control signals UP and DOWN which are provided to charge pump 104 to raise or lower an output current.

The charge pump 104 is coupled to receive control signals UP and DOWN at inputs, and in turn, generates control voltage signal (VCTRL) at an output coupled at node labeled VCTRL. The control voltage VCTRL rises or falls depending on the current provided by the charge pump 104 to the node VCTRL. The control signal UP is used to raise the control voltage VCTRL. The control signal DOWN is used to lower the control voltage VCTRL. For example, when the UP signal is high and the DOWN signal is low, the capacitor 110 charges and the control voltage VCTRL increases. When the UP control signal is low and the DOWN control signal is high, the capacitor 110 discharges and the control voltage VCTRL decreases. When both UP signal and DOWN signal are high, the charge on capacitor 110 is held steady. When both the UP signal and the DOWN signal are low, the charge on capacitor 110 is held constant.

The VCDL 106 is coupled to receive reference clock REFCLK at a first input and voltage control signal VCTRL at a second input, and in turn, generates clock signals CLKOUT [N:0] at outputs. The VCDL 106 includes a plurality of buffers (see FIG. 5) connected in a serial chain, where the input to the first buffer is the reference clock REFCLK and outputs of each buffer in the chain corresponds to the output clocks CLKOUT[N:0]. The magnitude of delay introduced by each buffer is controlled by the control voltage VCTRL, which is provided to each buffer. Specifically, increasing the control voltage VCTRL decreases the delay, and decreasing the control voltage VCTRL increases the delay.

The initialization circuit 108 is coupled to provide an initial VCTRL voltage at the VCTRL node. The initial VCTRL voltage is provided to establish an initial delay amount in the VCDL 106 and thus, initializes the DLL in a vicinity of a desired locking frequency. By initializing the DLL in the vicinity of a desired locking point, the DLL is allowed to lock quickly and accurately after a power-up.

The capacitor 110 is coupled between the VCTRL node and a first voltage supply terminal labeled VSS. The first voltage supply terminal may also be referred to as a VSS voltage supply terminal. A first terminal of capacitor 110 is coupled to the VCTRL node and a second terminal of capacitor 110 is coupled to the VSS voltage supply terminal. When capacitor 110 charges, the VCTRL voltage increases, and when capacitor 110 discharges, the VCTRL voltage decreases. Capacitor 110 may act as a low-pass filter for DLL 100. Capacitor 110 can be formed with any suitable materials and structures available in a given process technology such as metal-oxide-semiconductor (MOS) capacitors, metal-insulator-metal (MIM) capacitors, polysilicon-insulator-polysilicon (PIP) capacitors, and the like, for example. The capacitance value of capacitor 110 may vary based upon circuit performance requirements. In this embodiment, capacitor 110 has a capacitance value of approximately 50 picofarads (pF).

Figure 2:
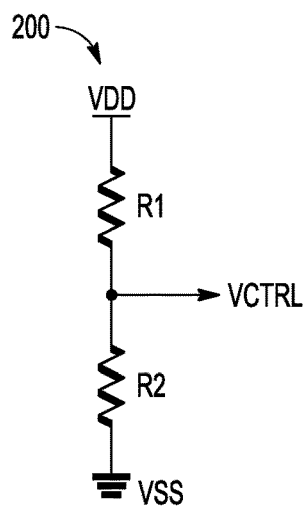
FIG. 2 illustrates, in schematic diagram form, an exemplary initialization circuit for a DLL.

FIG. 2 illustrates, in schematic diagram form, an exemplary initialization circuit 200 for a DLL. Initialization circuit 200 includes two resistors (R1, R2) coupled in series between a second voltage supply terminal labeled VDD and the VSS voltage supply terminal. The second voltage supply terminal may also be referred to as a VDD voltage supply terminal. The series arrangement of resistors R1 and R2 form a voltage divider to provide a VCTRL initialization voltage. For example, VCTRL is equal to a VDD voltage multiplied by the resistance of R2 divided by the sum of resistances of R1 plus R2. Here, VCTRL has an initialization voltage which tracks with the VDD voltage. The initialization voltage of initialization circuit 200 is independent of frequency, process, and temperature variations. A nominal operating voltage, typically referred to as VDD, may be provided at the VDD voltage supply terminal, and a 0-volt or ground voltage may be provided at the VSS voltage supply terminal.

Figure 3:
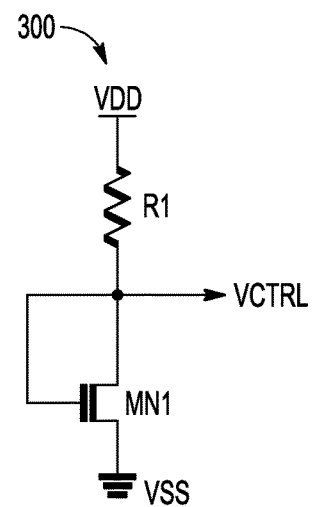
FIG. 3 illustrates, in schematic diagram form, another exemplary initialization circuit for a DLL.

FIG. 3 illustrates, in schematic diagram form, another exemplary initialization circuit 300 for a DLL. Initialization circuit 300 includes resistor (R1) and N-channel transistor (MN1) coupled in series between the VDD voltage supply terminal and the VSS voltage supply terminal. The series arrangement of resistor R1 and transistor MN1 form a voltage divider to provide a VCTRL initialization voltage. Here, VCTRL has an initialization voltage which tracks with VDD voltage, process, and temperature. The initialization voltage of initialization circuit 300 is independent of frequency variations. However, it is desirable for the initialization circuitry to track with frequency variations, as well, to ensure fast and accurate locking of the DLL across multiple frequencies of operation.

Figure 4:
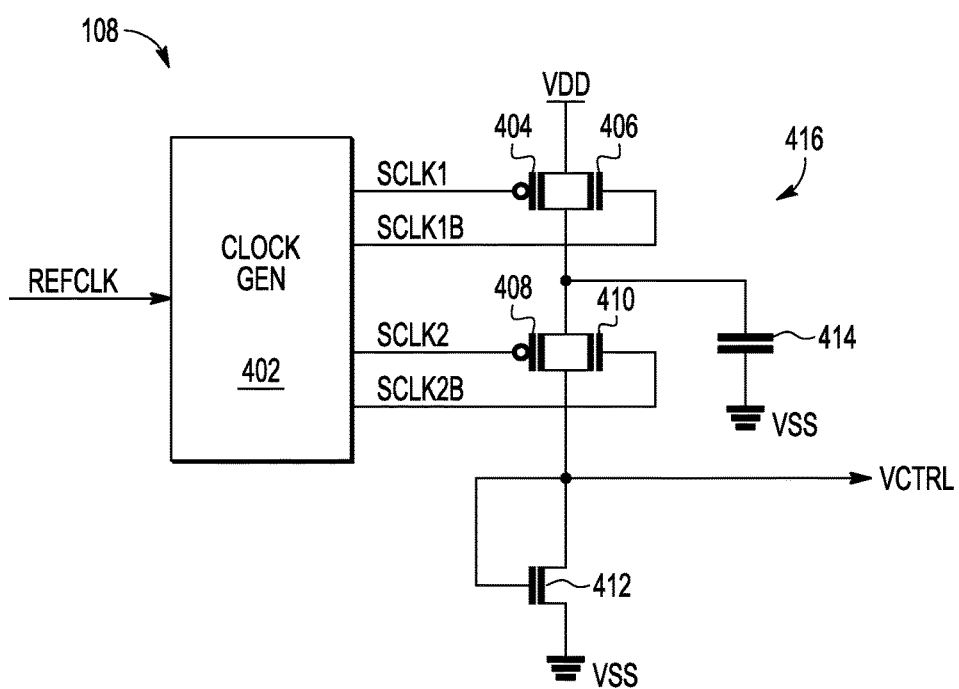
FIG. 4 illustrates, in schematic diagram form, an exemplary initialization circuit for a DLL in accordance with an embodiment of the present invention.

FIG. 4 illustrates, in schematic diagram form, exemplary initialization circuit 108 of the DLL 100 depicted in FIG. 1 in accordance with an embodiment of the present invention. Initialization circuit 108 receives reference clock REFCLK at an input and provides an initialization voltage at output VCTRL. Initialization circuit 108 includes a non-overlap clock generation circuit block 402, a first switch including transistors 404 and 406, a second switch including transistors 408 and 410, a diode connected transistor 412, and a capacitor 414.

Clock generation circuit 402 is coupled to receive reference clock REFCLK at an input and provide non-overlapping complementary clocks labeled SCLK1, SCLK1B, SCLK2 and SCLK2B at outputs. For example, clocks SCLK1 and SCLK2 are non-overlapping clock signals where SCLK2 is complementary to SCLK1. Accordingly, clock SCLK1B is complementary clock signal to SCLK1, and SCLK2B is a complementary clock signal to SCLK2.

The first switch of initialization circuit 108 includes P-channel transistor 404 and N-channel transistor 406 coupled in parallel to form a first complementary metal-oxide-semiconductor (CMOS) switch. The second switch of initialization circuit 108 includes P-channel transistor 408 and N-channel transistor 410 coupled in parallel to form a second CMOS switch. The first and second switches are coupled in series between the VDD voltage supply terminal and output of the initialization circuit 108 labeled VCTRL. First current electrodes of transistors 404 and 406 are coupled to the VDD voltage supply terminal, and second current electrodes of transistors 404 and 406 are coupled to first current electrodes of transistors 408 and 410. Second current electrodes of transistors 408 and 410 are coupled to a first current electrode and a control electrode of transistor 412 at output node VCTRL. A second current electrode of transistor 412 is coupled to the VSS voltage supply terminal. A first terminal of capacitor 414 is coupled to second current electrodes of transistors 404 and 406 first current electrodes of transistors 408 and 410. A second terminal of capacitor 414 is coupled to the VSS voltage supply terminal. In this embodiment, it may be desirable for transistors 404-410 to be formed as fast transistors having minimum channel lengths. Capacitor 414 can be formed with any suitable materials and structures available in a given process technology such as metal-oxide-semiconductor (MOS) capacitors, metal-insulator-metal (MIM) capacitors, polysilicon-insulator-polysilicon (PIP) capacitors, and the like, for example. The capacitance value of capacitor 414 may vary based upon circuit performance requirements. In this embodiment, capacitor 414 has a capacitance value of approximately 100 pF.

In operation, clocks SCLK1 and SCLK1B are in first respective states causing both transistors 404 and 406 to be in a conductive state. Likewise, clocks SCLK2 and SCLK2B are in first respective states causing both transistors 408 and 410 to be in a non-conductive state. Because transistors 404 and 406 are conducting and transistors 408 and 410 are not conducting, capacitor 414 may be charged. When clocks SCLK1 and SCLK1B transition to second respective states, both transistors 404 and 406 transition to be in a non-conductive state. After clocks SCLK1 and SCLK1B transition to second respective states, clocks SCLK2 and SCLK2B transition to second respective states causing both transistors 408 and 410 to be in a conductive state. Because transistors 404 and 406 are not conducting and transistors 408 and 410 are conducting, capacitor 414 may be discharged.

In the embodiment depicted in FIG. 4, transistors 404-410 with capacitor 414 form a switched capacitor resistive circuit element 416 coupled in series with diode connected transistor 412. The series arrangement of switched capacitor resistive circuit element 416 and diode connected transistor 412 forms a voltage divider to provide the VCTRL initialization voltage. Here, VCTRL has an initialization voltage which tracks with VDD frequency, and process, voltage, and temperature (PVT) variations. For example, the effective resistance of the switched capacitor resistive circuit element 416 can be modeled as 1 divided by desired frequency of DLL 100 multiplied by capacitance of capacitor 414. Because initialization circuit 108 tracks with frequency and PVT variations, DLL can be operated at various frequencies with fast and accurate locking.

Figure 5:
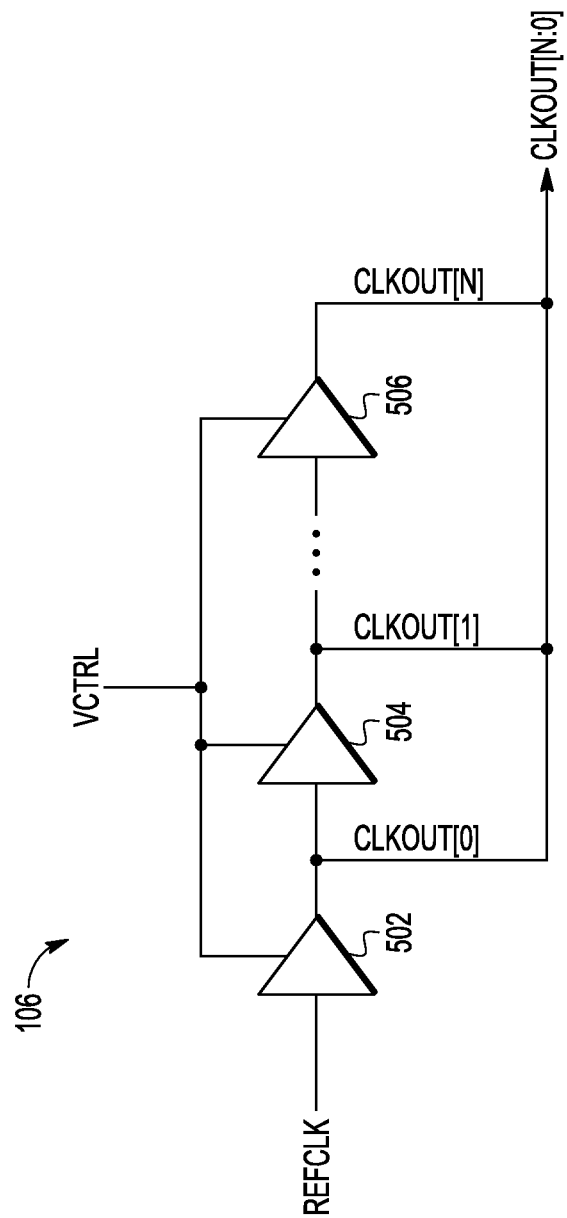
FIG. 5 illustrates, in schematic diagram form, an exemplary voltage-controlled delay loop (VCDL) circuit for a DLL in accordance with an embodiment of the present invention.

FIG. 5 illustrates, in schematic diagram form, an exemplary voltage-controlled delay loop (VCDL) circuit 106 of DLL 100 depicted in FIG. 1 in accordance with an embodiment of the present invention. VCDL circuit 106 receives reference clock REFCLK at a first input, control voltage VCTRL at a second input, and provides output clock signals CLKOUT[N:0] at an output labeled CLKOUT[N:0]. VCDL circuit 106 includes a plurality of delay buffer circuits (502-506) coupled in series forming a chain. Each buffer circuit (502-506) delays its input clock signal by τ/N to generate its corresponding output clock signal, where τ is the current phase delay between clock signals CLKOUT[0] and CLKOUT[N] and N is an integer number corresponding to a number of output clock signals (e.g., N=32). Note that any clock signal output by, or input to, any of the buffer circuits (502-506) may be referred to as a fractional delay signal. Each buffer circuit (502-506) receives the control voltage VCTRL at an input, which determines the magnitude of the delay τ/N (e.g., τ/32) introduced by each of the buffer circuits (502-506).

The buffer circuit 502 receives input clock REFCLK at an input and provides a fractional delay signal CLKOUT[0] at an output. The buffer circuit 504 receives the output of the buffer circuit 502 at its input and outputs a fractional delay signal CLKOUT[ ] having a fractional phase delay relative to the clock signal CLKOUT[0], and so on. The chain continues where the buffer circuit 506 receives a CLKOUT [N−1] output (not shown) at its input and outputs a fractional delay signal CLKOUT[N] having the phase delay of τ relative to the clock signal CLKOUT[0].

Figure 6:
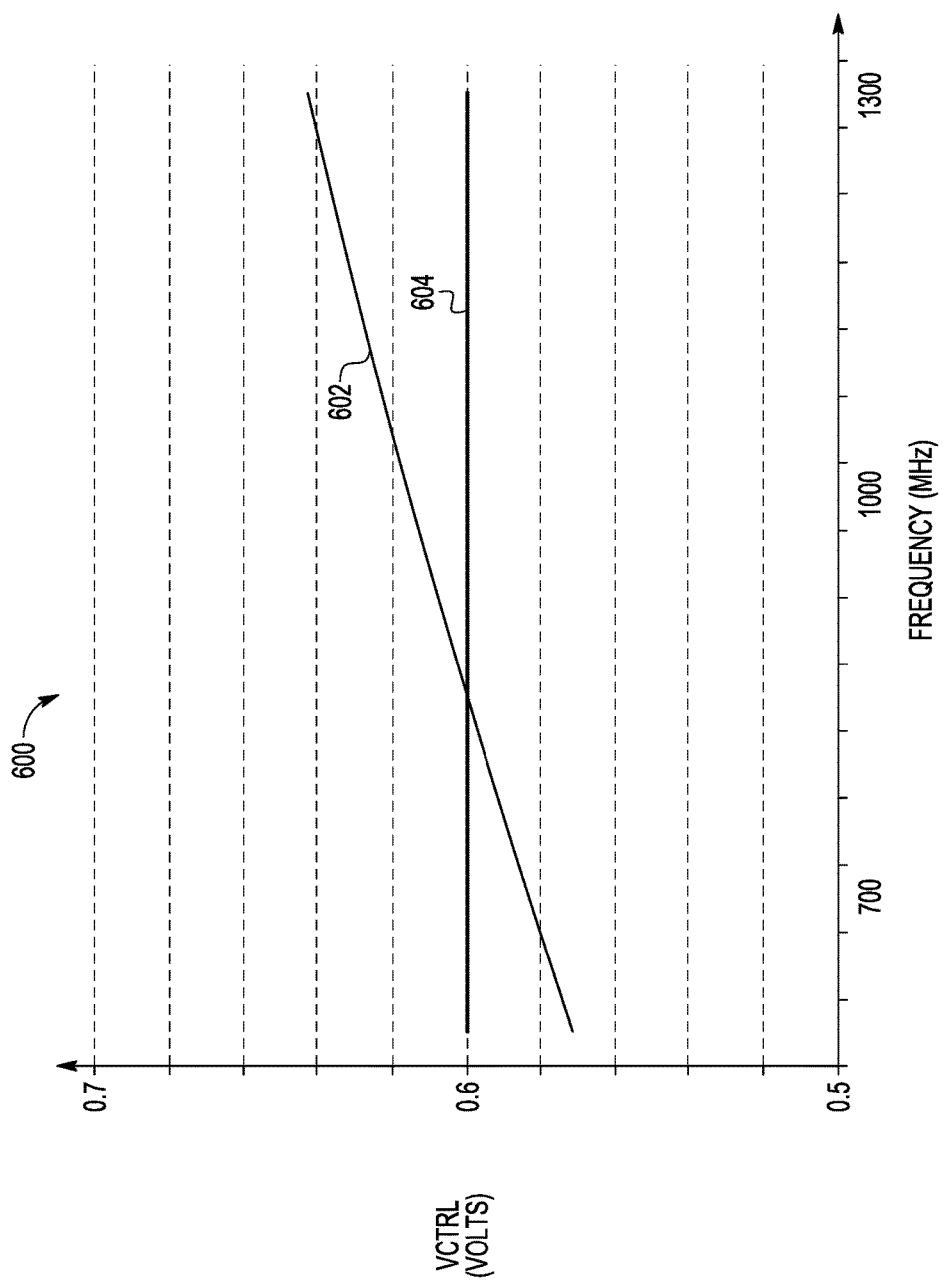
FIG. 6 illustrates, in plot diagram form, exemplary initialization voltage relationship with input frequency in accordance with an embodiment of the present invention.

FIG. 6 illustrates, in plot diagram form, exemplary initialization voltage relationship with input frequency in accordance with an embodiment of the present invention. Input reference clock signal (REFCLK) frequency values are shown in megahertz (MHz) on the X-axis, and corresponding initialization voltage values applied at the VCTRL node are shown in volts on Y-axis. Plot diagram 600 includes waveforms 602 and 604 depicting simulation results of initialization circuit 108 and initialization circuit 300 versus frequency. In this example, waveform 602 shows initialization voltages provided by initialization circuit 108 varying with frequency values while initialization voltages provided by initialization circuit 300 does not vary with frequency values as shown in waveform 604. Because initialization circuit 108 generates initialization voltages that track with frequency, the DLL circuit depicted in FIG. 1 accommodates a broader frequency range of operation and ensures fast and more accurate locking.

Generally, there is provided, a delay-locked loop (DLL) circuit including a delay line circuit configured to receive a reference clock signal at a first input and a control signal at a second input, and generate a first plurality of clock signals, each clock signal of the first plurality having a different phase delay relative to the reference clock signal; a phase frequency detector circuit coupled to the delay circuit, the phase frequency detector circuit configured to receive a first clock signal and a second clock signal of the first plurality, and generate up and down control signals; a charge pump coupled to receive the up and down control signals and generates a charge pump current based on the up and down control signals, an output of the charge pump coupled to the second input of the delay line circuit by way of a voltage control node; and an initialization circuit coupled to the voltage control node, the initialization circuit configured to generate an initialization voltage, the initialization voltage based on the reference clock signal frequency. A magnitude of the different phase delay relative to the reference clock signal may be based on the control signal. Each clock signal of the first plurality may have the same frequency as the reference clock signal. The delay line circuit may include a second plurality of delay buffer circuits coupled in series forming a chain, a first delay buffer circuit in the chain is coupled to the first input to receive the reference clock signal. An output of the first delay buffer circuit may be coupled to provide the first clock signal, and at least one delay buffer circuit in the chain may be coupled between the output of the first delay buffer circuit and the input of a second delay buffer circuit, the second delay buffer circuit coupled to provide the second clock signal. The delay line circuit may be characterized as a voltage-controlled delay line, and the control signal may be a control voltage signal that is provided to each delay buffer circuit of the second plurality to control the delay introduced by the delay buffer circuit. The circuit may further include a capacitor having a first terminal coupled to the voltage control node and a second terminal coupled to a first voltage supply terminal, the capacitor adapted to receive the charge pump current. The initialization circuit may include a switched capacitor circuit coupled between a second voltage supply terminal and the voltage control node. The phase frequency detector circuit may generate the up and down control signals based on a detected phase difference between the first clock signal and the second clock signal.

In another embodiment, there is provided, an integrated circuit including a delay line circuit configured to receive a reference clock signal and a voltage control signal, and generate a first plurality of fractional delay signals having different phase delays relative to the reference clock signal, magnitudes of the different phase delays based on the voltage control signal; a phase frequency detector circuit coupled to receive a first fractional delay signal and a second fractional delay signal of the first plurality of fractional delay signals, and based on a detected phase difference between the first fractional delay signal and the second fractional delay signal generate up and down control signals; a charge pump coupled to receive the up and down control signals and generates a charge pump current based on the up and down control signals, the charge pump coupled to the delay line circuit by way of a voltage control node; and an initialization circuit coupled to the voltage control node, the initialization circuit configured to generate an initial voltage control signal based on the reference clock signal frequency. The circuit may further include a capacitor having a first terminal coupled to the voltage control node and a second terminal coupled to a first voltage supply terminal, the capacitor adapted to receive the charge pump current. The initialization circuit may include a switched capacitor circuit coupled between a second voltage supply terminal and the voltage control node. The switched capacitor circuit may be coupled to receive non-overlapping clock signals based on the reference clock signal. The initialization circuit may further include a diode connected transistor coupled between the voltage control node and the first voltage supply terminal. The delay line circuit may include a second plurality of fractional delay buffer circuits coupled in series forming a chain, a first fractional delay buffer circuit in the chain is coupled to provide the first fractional delay signal. A second fractional delay buffer circuit in the chain may be coupled to provide the second fractional delay signal, at least one delay buffer circuit in the chain may be coupled between the first delay buffer circuit and the second delay buffer circuit.

In yet another embodiment, there is provided, a method including generating at a voltage-controlled delay line a first plurality of fractional delay signals having different phase delays relative to a reference clock signal, magnitudes of the different phase delays based on a voltage control signal; generating at a phase frequency detector up and down control signals based on a detected phase difference between a first fractional delay signal and a second fractional delay signal of the first plurality; responsive to the up and down control signals received at a charge pump, generating a charge pump current, the charge pump current provided to a first capacitor to generate the voltage control signal; and initializing the voltage control signal to an initial voltage based on the reference clock signal received at an initialization circuit. Initializing the voltage control signal may include generating non-overlap clock signals based on the reference clock signal and applying the non-overlap clock signals to a switched capacitor circuit to generate the initial voltage. The voltage-controlled delay line may include forming a chain of delay buffer circuits coupled in series, and receiving the reference clock signal at an input of a first delay buffer circuit in the chain. The voltage-controlled delay line may further include providing the first fractional delay signal at an output of the first delay buffer circuit and providing the second fractional delay signal at an output of a second delay buffer circuit, at least one delay buffer circuit in the chain is coupled between the output of the first delay buffer circuit and an input of the second delay buffer circuit.

By now it should be appreciated that there has been provided, DLL initialization circuitry which tracks input frequency and process, voltage, and temperature (PVT) variations, and generates an initialization point within the proximity of a desired lock point, ensuring correct locking over a broad range of operating frequencies. A reference clock received by a voltage-controlled delay line is also provided to the DLL initialization circuitry. By using a switched capacitor circuit controlled by non-overlapping versions of the reference clock, an initialization voltage signal is generated which tracks the reference clock frequency and allows fast and accurate DLL locking.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:
1. A delay-locked loop (DLL) circuit comprising:
a delay line circuit configured to receive a reference clock signal at a first input and a control signal at a second input, and generate a first plurality of clock signals, each clock signal of the first plurality having a different phase delay relative to the reference clock signal;
a phase frequency detector circuit coupled to the delay circuit, the phase frequency detector circuit configured to receive a first clock signal and a second clock signal of the first plurality, and generate up and down control signals;
a charge pump coupled to receive the up and down control signals and generates a charge pump current based on the up and down control signals, an output of the charge pump coupled to the second input of the delay line circuit by way of a voltage control node; and
an initialization circuit coupled to the voltage control node, the initialization circuit comprising a switched capacitor circuit coupled between a second voltage supply terminal and the voltage control node and configured to generate an initialization voltage, the initialization voltage based on the reference clock signal frequency.

2. The circuit of claim 1, wherein a magnitude of the different phase delay relative to the reference clock signal is based on the control signal.

3. The circuit of claim 1, wherein each clock signal of the first plurality has the same frequency as the reference clock signal.

4. The circuit of claim 1, wherein the delay line circuit comprises a second plurality of delay buffer circuits coupled in series forming a chain, a first delay buffer circuit in the chain is coupled to the first input to receive the reference clock signal.

5. The circuit of claim 4, wherein an output of the first delay buffer circuit is coupled to provide the first clock signal, and at least one delay buffer circuit in the chain is coupled between the output of the first delay buffer circuit and the input of a second delay buffer circuit, the second delay buffer circuit coupled to provide the second clock signal.

6. The circuit of claim 4, wherein the delay line circuit is characterized as a voltage-controlled delay line, and the control signal is a control voltage signal that is provided to each delay buffer circuit of the second plurality to control the delay introduced by the delay buffer circuit.

7. The circuit of claim 1, further comprising a capacitor having a first terminal coupled to the voltage control node and a second terminal coupled to a first voltage supply terminal, the capacitor adapted to receive the charge pump current.

8. The circuit of claim 1, wherein the phase frequency detector circuit generates the up and down control signals based on a detected phase difference between the first clock signal and the second clock signal.

9. An integrated circuit comprising:
a delay line circuit configured to receive a reference clock signal and a voltage control signal, and generate a first plurality of fractional delay signals having different phase delays relative to the reference clock signal, magnitudes of the different phase delays based on the voltage control signal;
a phase frequency detector circuit coupled to receive a first fractional delay signal and a second fractional delay signal of the first plurality of fractional delay signals, and based on a detected phase difference between the first fractional delay signal and the second fractional delay signal generate up and down control signals;
a charge pump coupled to receive the up and down control signals and generates a charge pump current based on the up and down control signals, the charge pump coupled to the delay line circuit by way of a voltage control node;
a capacitor having a first terminal coupled to the voltage control node and a second terminal coupled to a first voltage supply terminal, the capacitor adapted to receive the charge pump current; and
an initialization circuit coupled to the voltage control node, the initialization circuit comprising a switched capacitor circuit coupled between a second voltage supply terminal and the voltage control node and configured to generate an initial voltage control signal based on the reference clock signal frequency.

10. The circuit of claim 9, wherein the switched capacitor circuit is coupled to receive non-overlapping clock signals based on the reference clock signal.

11. The circuit of claim 9, wherein the initialization circuit further comprises a diode connected transistor coupled between the voltage control node and the first voltage supply terminal.

12. The circuit of claim 9, wherein the delay line circuit comprises a second plurality of fractional delay buffer circuits coupled in series forming a chain, a first fractional delay buffer circuit in the chain is coupled to provide the first fractional delay signal.

13. The circuit of claim 12, wherein a second fractional delay buffer circuit in the chain is coupled to provide the second fractional delay signal, at least one delay buffer circuit in the chain is coupled between the first delay buffer circuit and the second delay buffer circuit.

14. A method comprising:
generating at a voltage-controlled delay line a first plurality of fractional delay signals having different phase delays relative to a reference clock signal, magnitudes of the different phase delays based on a voltage control signal;
generating at a phase frequency detector up and down control signals based on a detected phase difference between a first fractional delay signal and a second fractional delay signal of the first plurality;
responsive to the up and down control signals received at a charge pump, generating a charge pump current, the charge pump current provided to a first capacitor to generate the voltage control signal; and
initializing the voltage control signal to an initial voltage based on the reference clock signal received at an initialization circuit, wherein initializing the voltage control signal comprises generating non-overlap clock signals based on the reference clock signal and applying the non-overlap clock signals to a switched capacitor circuit to generate the initial voltage.

15. The method of claim 14, wherein the voltage-controlled delay line comprises forming a chain of delay buffer circuits coupled in series, and receiving the reference clock signal at an input of a first delay buffer circuit in the chain.

16. The method of claim 15, wherein the voltage-controlled delay line further comprises providing the first fractional delay signal at an output of the first delay buffer circuit and providing the second fractional delay signal at an output of a second delay buffer circuit, at least one delay buffer circuit in the chain is coupled between the output of the first delay buffer circuit and an input of the second delay buffer circuit.

* * * * *